United States Patent
Lee et al.

(10) Patent No.: US 7,205,791 B1
(45) Date of Patent: Apr. 17, 2007

(54) BYPASS-ABLE CARRY CHAIN IN A PROGRAMMABLE LOGIC DEVICE

(75) Inventors: Andy L. Lee, San Jose, CA (US); Ninh Ngo, San Jose, CA (US); Vaughn Betz, Toronto (CA); David Lewis, Toronto (CA); Bruce Pederson, Sunnyvale, CA (US); James Schleicher, Los Gatos, CA (US)

(73) Assignee: Altera Corporation, San Jose, CA (US)

(*) Notice: Subject to any disclaimer, the term of this patent is extended or adjusted under 35 U.S.C. 154(b) by 306 days.

(21) Appl. No.: 10/799,872

(22) Filed: Mar. 12, 2004

(51) Int. Cl.
*H03K 19/173* (2006.01)

(52) U.S. Cl. .................. 326/41; 326/38; 326/39; 326/47; 708/232; 708/235; 708/710

(58) Field of Classification Search ........... 326/41, 326/38–39, 47; 708/710–714, 23–246
See application file for complete search history.

(56) References Cited

U.S. PATENT DOCUMENTS

| | | | |
|---|---|---|---|
| 5,258,668 A | 11/1993 | Cliff | |
| 5,274,581 A | 12/1993 | Cliff | |
| 5,295,090 A | 3/1994 | Hsieh | |
| 5,349,250 A | 9/1994 | New | |
| 5,359,242 A | 10/1994 | Veenstra | |
| 5,365,125 A | 11/1994 | Goetting | |
| 5,481,206 A | 1/1996 | New | |
| 5,481,486 A | 1/1996 | Cliff | |
| 5,483,478 A | 1/1996 | Chiang | |
| 5,500,608 A | 3/1996 | Goetting | |
| 5,523,963 A | 6/1996 | Hsieh | |
| 5,546,018 A | 8/1996 | New | |
| 5,629,886 A | 5/1997 | New | |
| 5,631,576 A | 5/1997 | Lee | |
| 5,672,985 A | 9/1997 | Lee | |
| 5,675,262 A | 10/1997 | Duong | |
| 5,689,195 A * | 11/1997 | Cliff et al. | 326/41 |
| 5,724,276 A | 3/1998 | Rose | |
| 5,761,099 A | 6/1998 | Pedersen | |
| 5,818,255 A | 10/1998 | New | |
| RE35,977 E | 12/1998 | Cliff | |
| 5,889,411 A | 3/1999 | Chaudhary | |
| 5,898,318 A | 4/1999 | Pedersen | |
| 5,898,319 A | 4/1999 | New | |
| 5,898,602 A | 4/1999 | Rothman | |
| 6,107,827 A | 8/2000 | Young | |
| 6,154,052 A | 11/2000 | New | |
| 6,154,053 A | 11/2000 | New | |
| 6,157,209 A | 12/2000 | McGettigan | |
| 6,288,570 B1 | 9/2001 | New | |
| 6,359,468 B1 * | 3/2002 | Park et al. | 326/39 |
| 6,937,064 B1 * | 8/2005 | Lewis et al. | 326/40 |
| 7,061,268 B1 * | 6/2006 | Lee et al. | 326/39 |

* cited by examiner

*Primary Examiner*—Rexford Barnie
*Assistant Examiner*—Jason Crawford
(74) *Attorney, Agent, or Firm*—Beyer Weaver LLP

(57) ABSTRACT

A carry chain in a logic array block includes a first path connecting a first series of logic elements in the logic array block, where the logic elements in the first series is a subset of the set of logic elements in the logic array block. The carry chain also includes a second path connecting a second series of logic elements in the logic array block, where one or more of the logic elements in the second series are not in the first series.

25 Claims, 14 Drawing Sheets

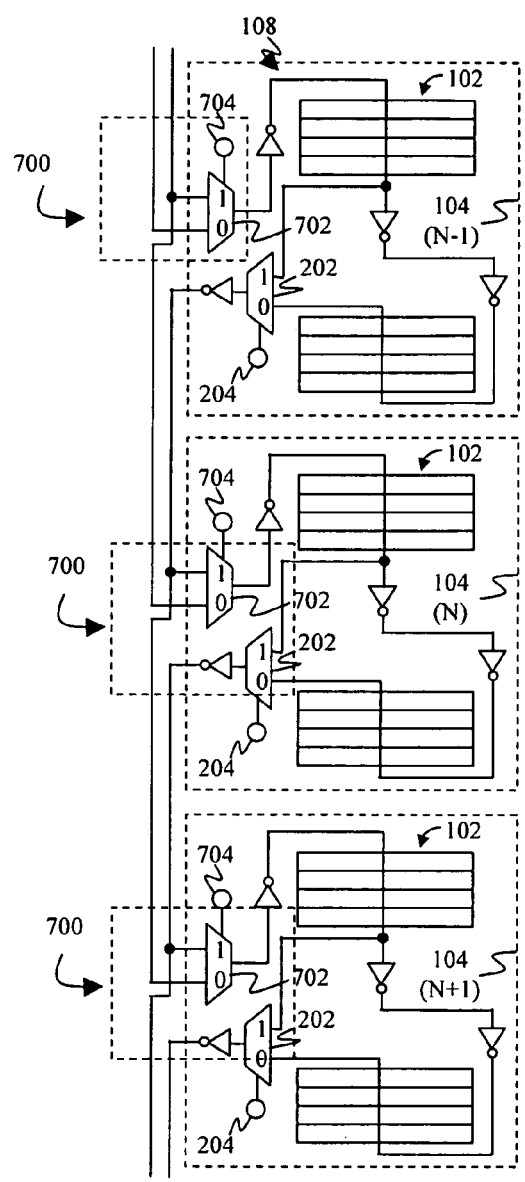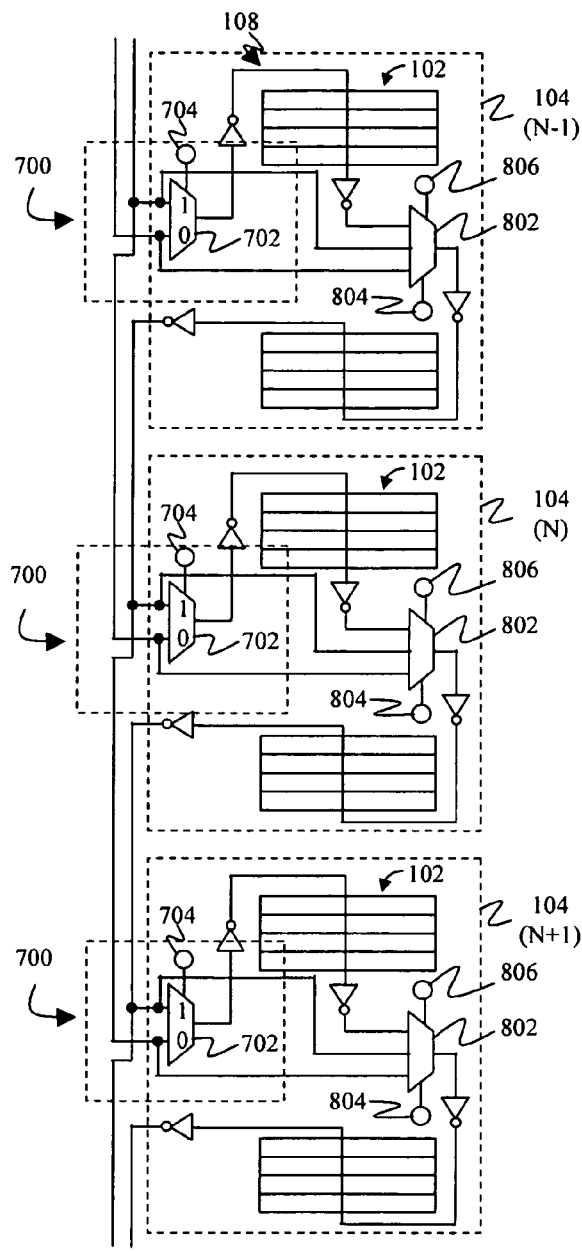
FIG. 7
FIG. 8

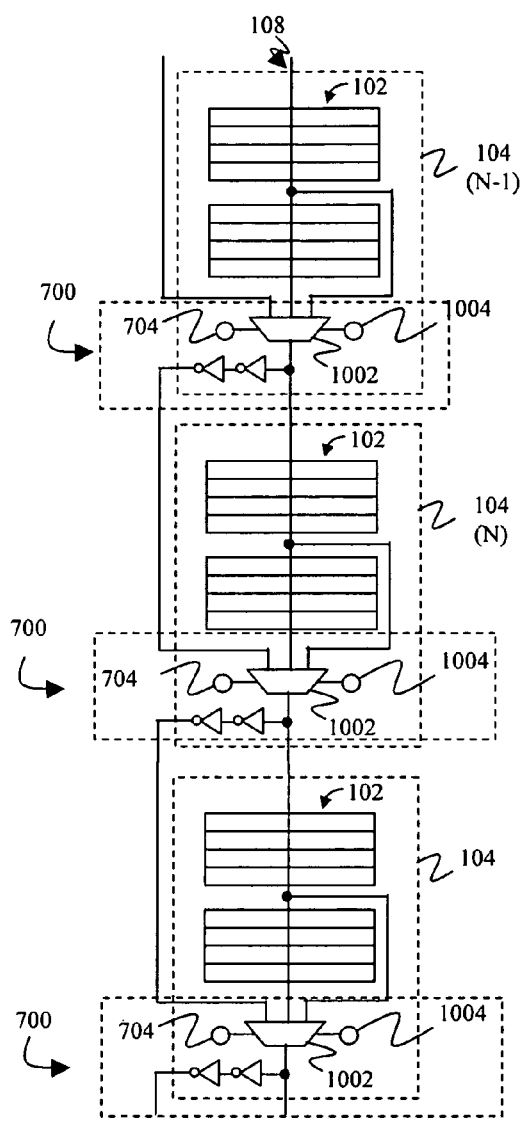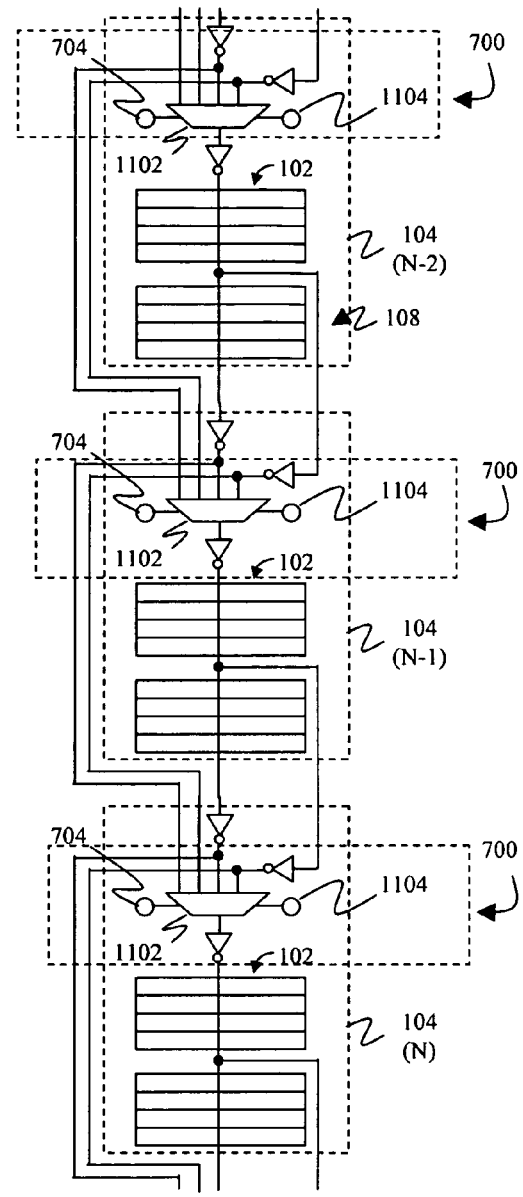
FIG. 10
FIG. 11

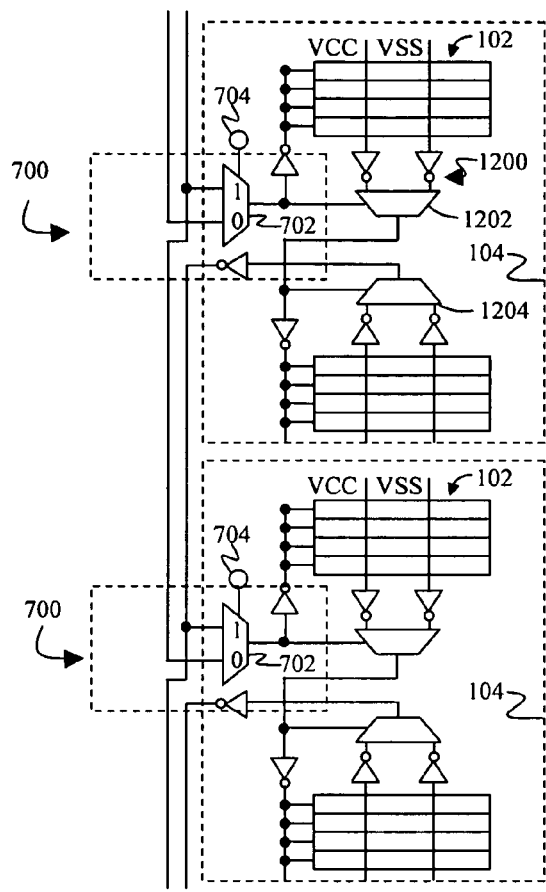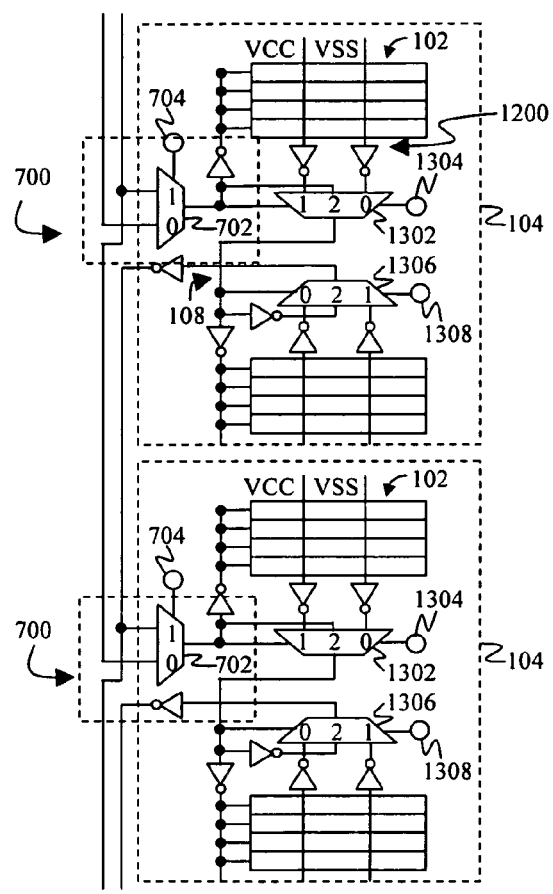
FIG. 12                    FIG. 13

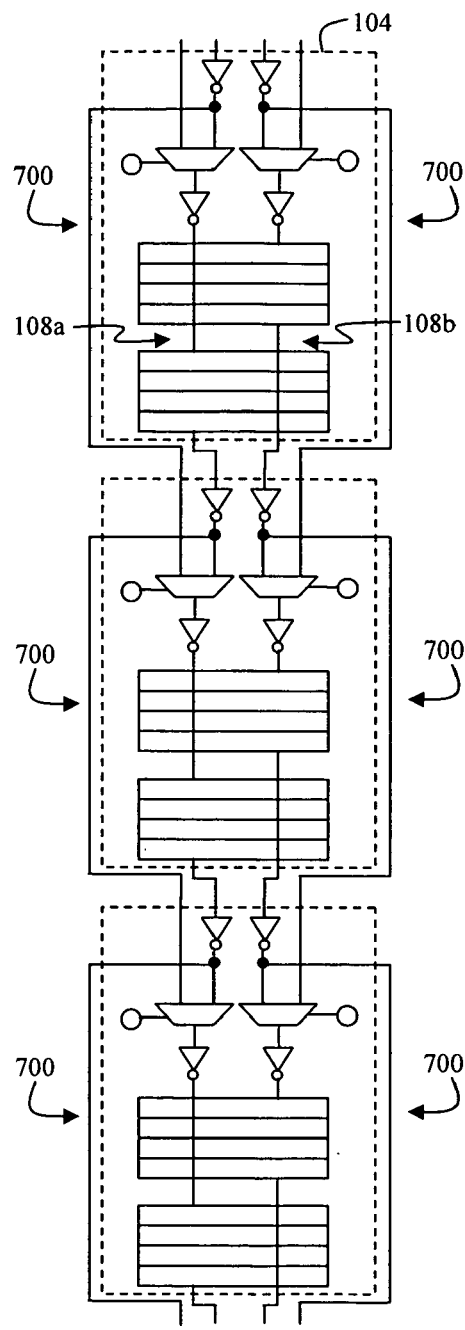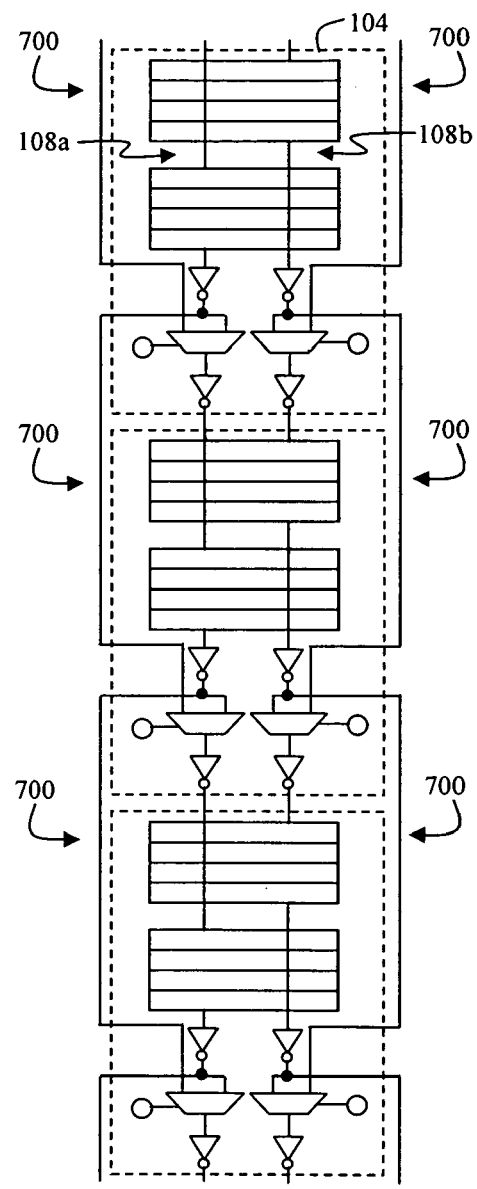
FIG. 16
FIG. 17

BYPASS-ABLE CARRY CHAIN IN A PROGRAMMABLE LOGIC DEVICE

BACKGROUND

1. Field of the Invention

The present application relates to programmable logic devices, and more particularly to a bypass-able carry chain in a programmable logic device.

2. Related Art

A programmable logic device ("PLD") is a digital, user-configurable integrated circuit used to implement a custom logic function. For the purposes of this description, the term PLD encompasses any digital logic circuit configured by the end-user, and includes a programmable logic array ("PLA"), a field programmable gate array ("FPGA"), and an erasable and complex PLD. The basic building block of a PLD is a logic element (LE) that is capable of performing logic functions on a number of input variables. A LE is typically equipped with circuitry to programmably implement the "sum of products" logic or look-up table logic, as well as one or more registers to implement sequential logic. Conventional PLDs combine together large numbers of such logic elements through an array of programmable interconnects to facilitate implementation of complex logic functions. PLDs have found particularly wide application as a result of their combined low up front cost and versatility to the user.

In a typical PLD architecture, an arithmetic mode of the LE is provided to implement faster arithmetic. In this mode, carry-chain logic is used between LEs to provide a fast rippling carry chain through a series of LEs, with each LE implementing a bit-slice of the arithmetic.

For example, with reference to FIG. 1, a typical PLD architecture 100 is depicted. PLD architecture 100 includes an array of logic elements (LEs) 102. Sets of LEs 102 are grouped together as logic array blocks (LABs) 104. A LAB 104 includes a carry chain 108, which connects the set of LEs in LAB 104. As depicted in FIG. 1, a carry-input signal ($C_{in}$) enters through the first LE 102 in LAB 104, propagates serially through each LE 102, then a carry-out signal ($C_{out}$) exits through the last LE 102. Because carry chain 108 propagates serially through each LE 102 in LAB 104, each LE 102 within LAB 104 is forced to be in arithmetic mode, unless carry chain 108 is broken within LAB 104. Breaking a carry chain 108, however, can increase the delay for the logic and result in waste since the LEs 102 following the break in the carry chain 108 can not be used to perform other functions.

As also depicted in FIG. 1, PLD architecture 100 includes a number of input lines 106 into LAB 104. The number of input lines 106 for a LAB 104 is typically determined based on the typical usage rather than the maximum usage of LAB 104. Thus, a complex arithmetic operation may require more inputs per LE 102 than the typical usage, which can result in insufficient number of input lines 106 to fully support the carry chain.

SUMMARY

In one exemplary embodiment, a carry chain in a logic array block includes a first path connecting a first series of logic elements in the logic array block, where the logic elements in the first series is a subset of the set of logic elements in the logic array block. The carry chain also includes a second path connecting a second series of logic elements in the logic array block, where one or more of the logic elements in the second series are not in the first series.

DESCRIPTION OF DRAWING FIGURES

The present application can be best understood by reference to the following description taken in conjunction with the accompanying drawing figures, in which like parts may be referred to by like numerals:

FIGS. 7–11 are block diagrams of exemplary LABs with carry chains and redundancy circuits;

FIG. 12 is a block diagram of exemplary LABs with redundancy circuits and carry select circuits;

FIGS. 13 and 14 are block diagrams of exemplary LABs with redundancy circuits, carry select circuits, and carry chains;

FIGS. 15–17 are block diagrams of exemplary LABs with carry chains having fixed bypass portions;

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

I. Bypass-able Carry Chain

Figure 1:
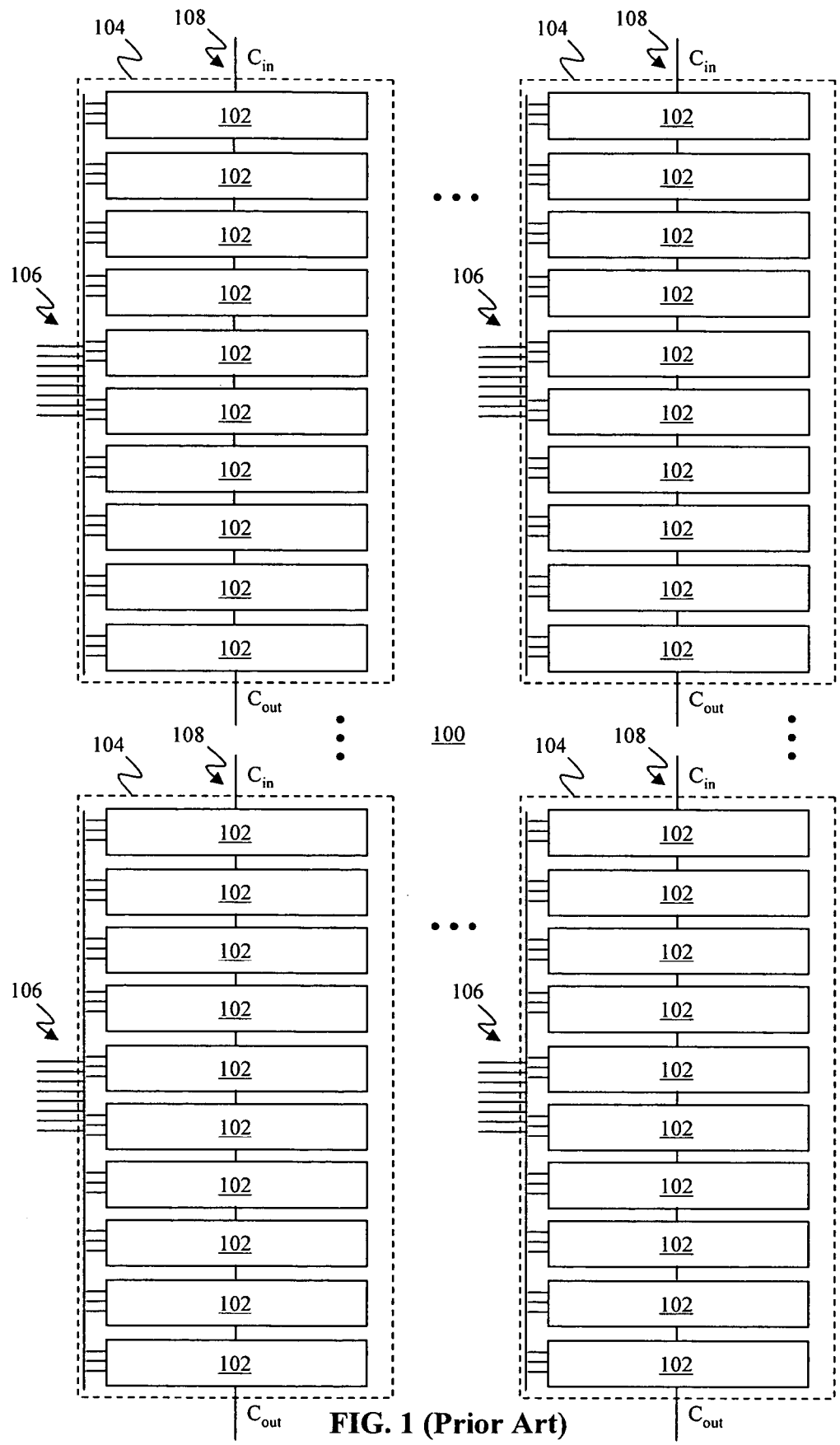
FIG. 1 is a block diagram of a conventional programmable logic device (PLD) architecture.
Figure 2:
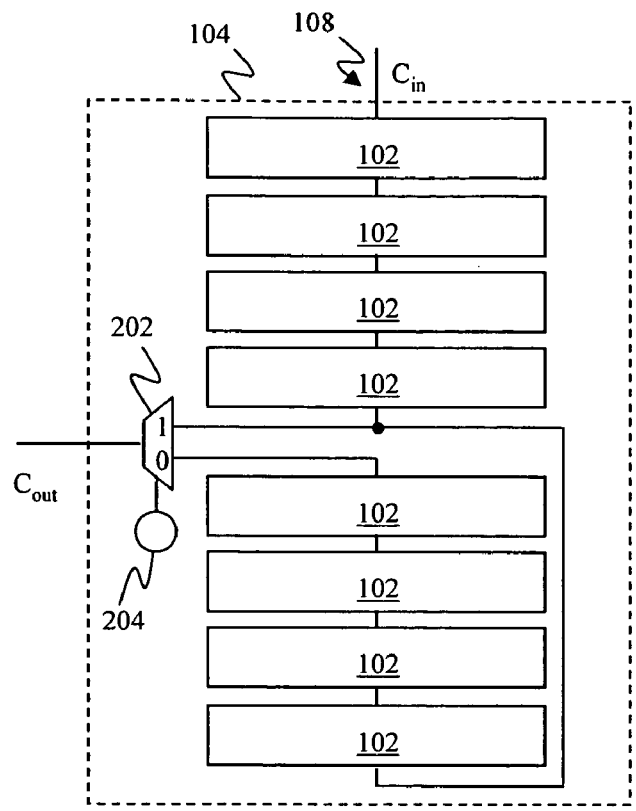
FIGS. 2–6 are block diagrams of exemplary logic array blocks (LABs) with carry chains.

With reference to FIG. 2, in one exemplary embodiment a LAB 104 includes a set of LEs 102 and a carry chain 108. Carry chain 108 includes a first path connecting a first series of LEs 102 in LAB 104, where the LEs 102 in the first series is a subset of the LEs 102 in LAB 104. Carry chain 108 also includes a second path connecting a second series of LEs 102 in LAB 104, where one or more of the LEs 102 in the second series are not in the first series. In the present exemplary embodiment, the LEs 102 in the first series are a subset of the LEs 102 in the second series.

As depicted in FIG. 2, in the present exemplary embodiment, the first path includes only the top four LEs 102 in LAB 104. In the present exemplary embodiment, the second path includes the top four and bottom four LEs 102 in LAB 104. It should be recognized that LAB 104 can include any number of LEs 102, and the first path can include any number of LEs 102, which are a subset of the set of LEs 102 in LAB 104. Additionally, it should be recognized that any number of LABs 104 can be arranged in an array as part of an exemplary PLD architecture.

Additionally, in the present exemplary embodiment, carry chain 108 includes one or more logic components to select between the first path and the second path. More particularly, in the exemplary embodiment depicted in FIG. 2, carry chain 108 includes a multiplexer 202 connected to a random access memory (RAM) bit 204 to select between a first input and a second input. Thus, carry chain 108 can be operated in a first mode and a second mode. When carry chain 108 is operated in the first mode, the first input of multiplexer 202 is selected and the carry signal is propagated through the first series of LEs 102. When carry chain 108 is operated in the second mode, the second input of multiplexer 202 is selected and the carry signal is propagated through the second series of LEs 102.

Again, as depicted in FIG. 2, when carry chain 108 is operated in the first mode, the carry signal propagates through only the top four of the eight LEs 102 in LAB 104. When carry chain 108 is operated in the second mode, the carry signal propagates through all eight LEs 102 in LAB 104. Thus, carry chain 108 is a bypass-able carry chain in that the bottom four LEs 102 in LAB 104 can be bypassed or excluded from carry chain 108. As described in greater detail below, the bypass-able portion of carry chain 108 can be located at any location (e.g., middle, top, etc.) within LAB 104.

In some applications, such as when the number of input lines into LAB 104 is sufficient for the arithmetic operation to be performed, all of the LEs 102 in LAB 104 can be used as part of carry chain 108 to perform the arithmetic operation. However, in some applications, such as when the number of input lines in LAB 104 is insufficient for the arithmetic operation to be performed, a subset of the LEs 102 in LAB 104 can be used as part of carry chain 108 to perform the arithmetic operation. The LEs 102 that are bypassed from carry chain 108 can then be used for various functions other than the arithmetic function being performed by carry chain 108. For example, the LEs 102 that are bypassed can be used in a logic mode while the LEs 102 in carry chain 108 can be used in an arithmetic mode.

II. Location of Bypass-able Portion

In the exemplary embodiment depicted in FIG. 2, the bottom portion of LAB 104 is bypass-able, meaning that one or more LEs 102 located in the bottom portion of LAB 104 can be bypassed from carry chain 108. It should be recognized, however, that the bypass-able portion of carry chain 108 can be located at any location within LAB 104.

Figure 3:
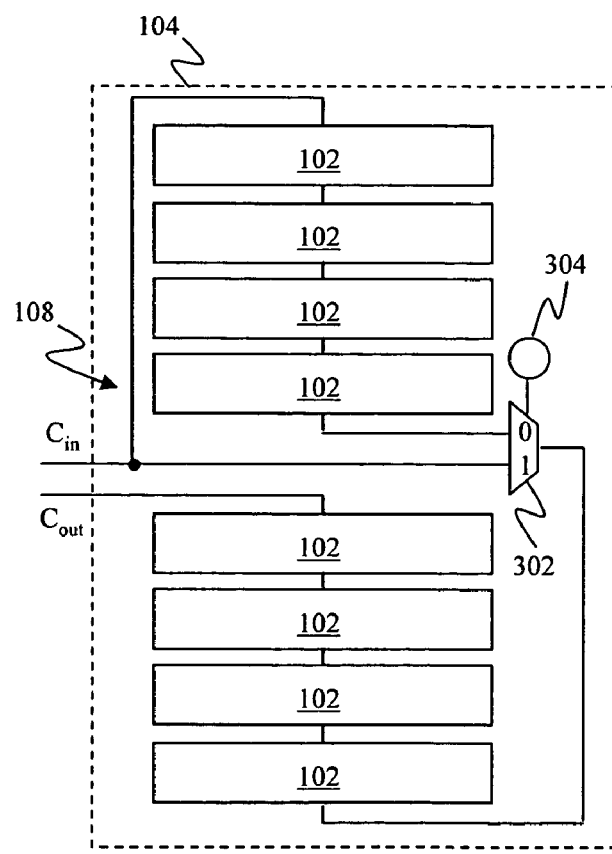

For example, in another exemplary embodiment depicted in FIG. 3, the bypass-able portion of carry chain 108 is located at the top of LAB 104. More particularly, carry chain 108 includes a multiplexer 302 connected to a RAM bit 304 to select between a first input and a second input. When carry chain 108 is operated in a first mode, the first input of multiplexer 302 is selected and a carry signal is propagated through a first series of LEs 102. When carry chain 108 is operated in a second mode, the second input of multiplexer 302 is selected and a carry signal is propagated through a second series of LEs 102, where one or more of the LEs 102 in the second series are not in the first series. In the present exemplary embodiment, the LEs 102 in the first series are a subset of the LEs 102 in the second series.

Figure 4:
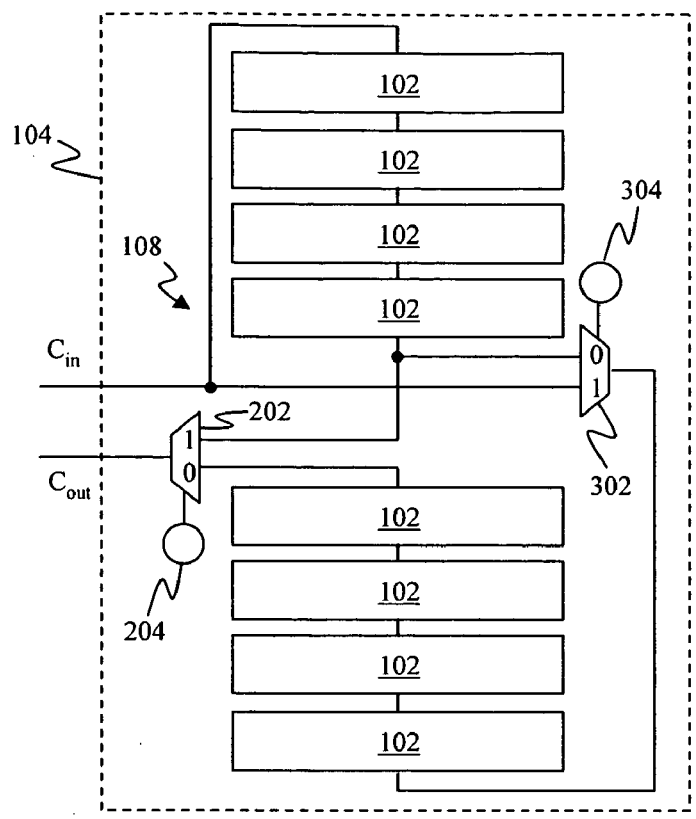

In still another exemplary embodiment depicted in FIG. 4, the bypass-able portion of carry chain 108 is selectable between a first location and a second location within LAB 104. More particularly, carry chain 108 includes a first multiplexer 302 connected to a first RAM bit 304 to select between a first input and a second input of first multiplexer 302. Carry chain 108 also includes a second multiplexer 202 connected to a second RAM bit 204 to select between a first input and a second input of second multiplexer 202. The first multiplexer 302 can be used to bypass a first series of LEs 102 located in the top portion of LAB 104. The second multiplexer 202 can be used to bypass a second series of LEs 102 located in the bottom portion of LAB 104.

III. Location of Logic Components

In the exemplary embodiments depicted and described thus far, the logic components used to bypass the LEs in a portion of the LAB have been located in the middle of the LAB. It should be recognized, however, that these logic components can be located at various locations in the LAB.

Figure 5:
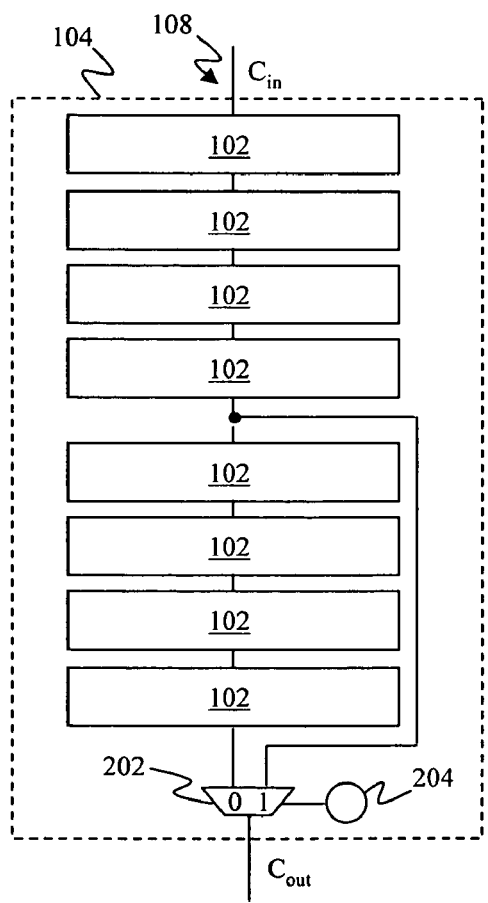

For example, in an exemplary embodiment depicted in FIG. 5, multiplexer 202 is located at the bottom of LAB 104. In this exemplary embodiment, the bypass-able portion of carry chain 108 is located at the bottom of LAB 104.

Figure 6:
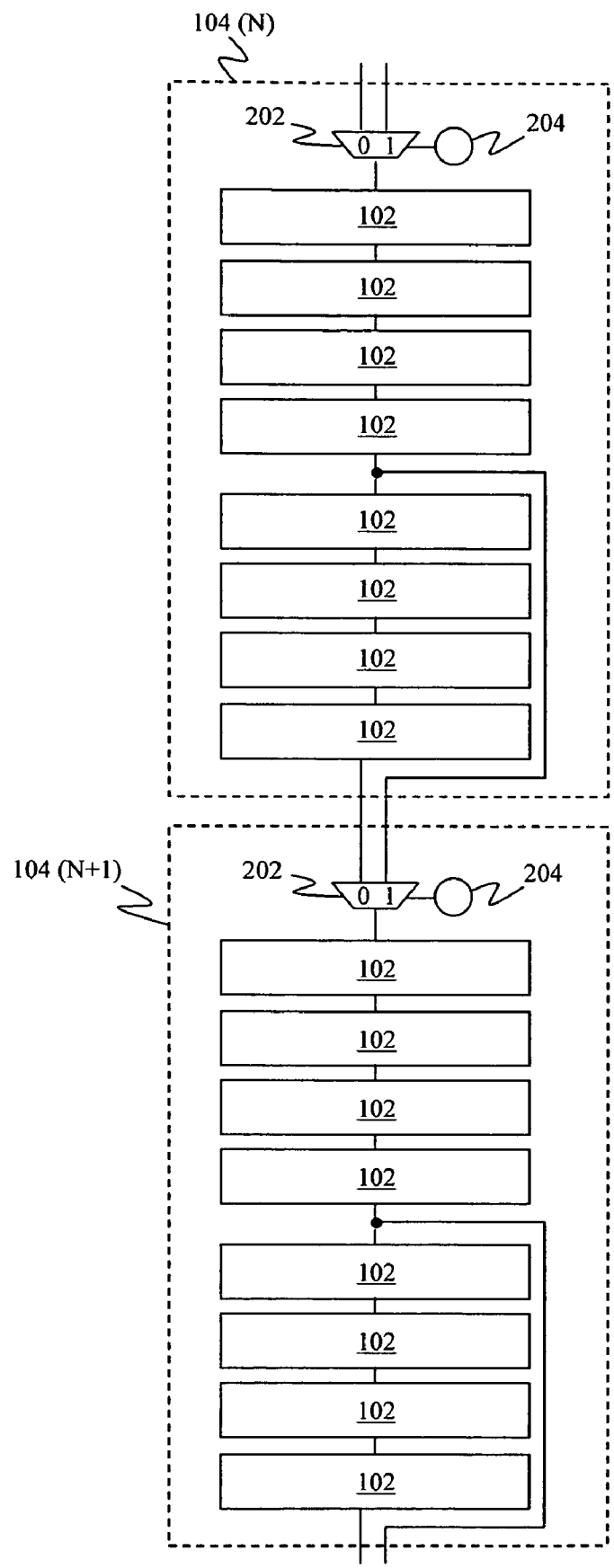

In another exemplary implementation depicted in FIG. 6, multiplexer 202 is located at the top of LAB 104. In this exemplary implementation, the bypass-able portion of carry chain 108 is located at the bottom of LAB 104. Additionally, in this exemplary implementation, multiplexer 202 in a subsequent LAB 104 in carry chain 108 controls the bypassing of LEs 102 in a preceding LAB 104 in carry chain 108.

For example, as depicted in FIG. 6, assume that carry chain 108 propagates from LAB 104 (N) to LAB 104 (N+1). Thus, multiplexer 202 in LAB 104 (N+1) controls the passing of LEs 102 in LAB 104 (N).

IV. Row Redundancy

With reference to FIG. 7, in one exemplary embodiment, LAB 104 includes carry chain 108 and a redundancy circuit 700. As described above, an exemplary PLD architecture can include an array of LEs 102 and LABs 104. In the present exemplary embodiment, redundancy circuit 700 can be used to skip a LAB 104 in a column of LABs 104.

More particularly, redundancy circuit 700 includes a multiplexer 702 connected to a redundancy signal 704 to switch between a first input and a second input. The first input is connected to the output of carry chain 108 from a preceding LAB 104 in a preceding row. The second input is connected to the first input of a multiplexer 702 from a redundancy circuit 700 in a preceding LAB 104 in a preceding row. The output of multiplexer 702 is connected to carry chain 108. Thus, carry chain 108 can receive, as an input, the output of carry chain 108 from a preceding LAB 104 in a preceding row, which continues the carry chain from the preceding LAB 104. Alternatively, carry chain 108 can receive, as an input, the input into the redundancy circuit 700 in the preceding LAB 104 in the preceding row, which results in the preceding LAB 104 in the preceding row being skipped.

For example, as depicted in FIG. 7, a first input of multiplexer 702 in LAB 104 (N) is connected to the output of carry chain 108 from preceding LAB 104 (N−1) in a preceding row. A second input of multiplexer 702 in LAB 104 (N) is connected to input of multiplexer 702 in preceding LAB 104 (N−1). Thus, when the first input of multiplexer 702 in LAB 104 (N) is selected using redundancy signal 704, the output of carry chain 108 from preceding LAB 104 (N−1) is propagated to carry chain 108 in LAB 104 (N). However, when the second input of multiplexer 702 in LAB 104 (N) is selected using redundancy signal 704, the input of multiplexer 702 in the preceding LAB 104 (N−1) is received as an input to carry chain 108 in LAB 104 (N), which results in carry chain 108 in the preceding LAB 104 (N−1) being skipped.

In the present exemplary embodiment, redundancy signal 704 can be created from hardware that determines if a row of LABs 104 is defective and needs to be skipped. For example, laser-programmed fuses can be used to determine if a row of LABs 104 is defective during initialization of the device.

In the exemplary embodiment depicted in FIG. 7, the bypass-able portion of carry chain 108 is located in the bottom portion of LAB 104. As noted earlier, it should be recognized that the bypass-able portion of carry chain 108 can be located at various locations of LAB 104.

For example, in another exemplary embodiment depicted in FIG. 8, redundancy circuit 700 is connected to a carry chain 108 with a bypass-able portion located at the top portion of LAB 104. In the present exemplary embodiment, carry chain 108 includes a 3:1 multiplexer 802 connected to a RAM bit 804 and a redundancy signal 806 to select between a first input, a second input, and a third input. When the preceding LAB 104 (N–1) is not skipped and the bypass-able portion located at the top portion of LAB 104 (N) is not bypassed, the first input of multiplexer 802 is selected and a carry signal is propagated from carry chain 108 from the preceding LAB 104 (N–1) through a first set of LEs 102 in LAB 104 (N). When the preceding LAB 104 (N–1) is skipped and the bypass-able portion located at the top portion of LAB 104 (N) is not bypassed, the first input of multiplexer 802 is also selected. When the preceding LAB 104 (N–1) is not skipped and the bypass-able portion located at the top portion of LAB 104 (N) is bypassed, the second input of multiplexer 802 is selected and a carry signal is propagated from carry chain 108 from the preceding LAB 104 (N–1) through a second set of LEs 102 in LAB 104 (N), where the second set of LEs 102 is a subset of the LEs 102 in the first set of LEs 102. When the preceding LAB 104 (N–1) is skipped and the bypass-able portion located at the top portion of LAB 104 (N) is bypassed, the third input of multiplexer 802 is selected and a carry signal is propagated from the first input of redundancy circuit 700 from a preceding LAB 104 (N–1) in a preceding row through the second set of LEs 102 in LAB 104 (N).

Figure 9:
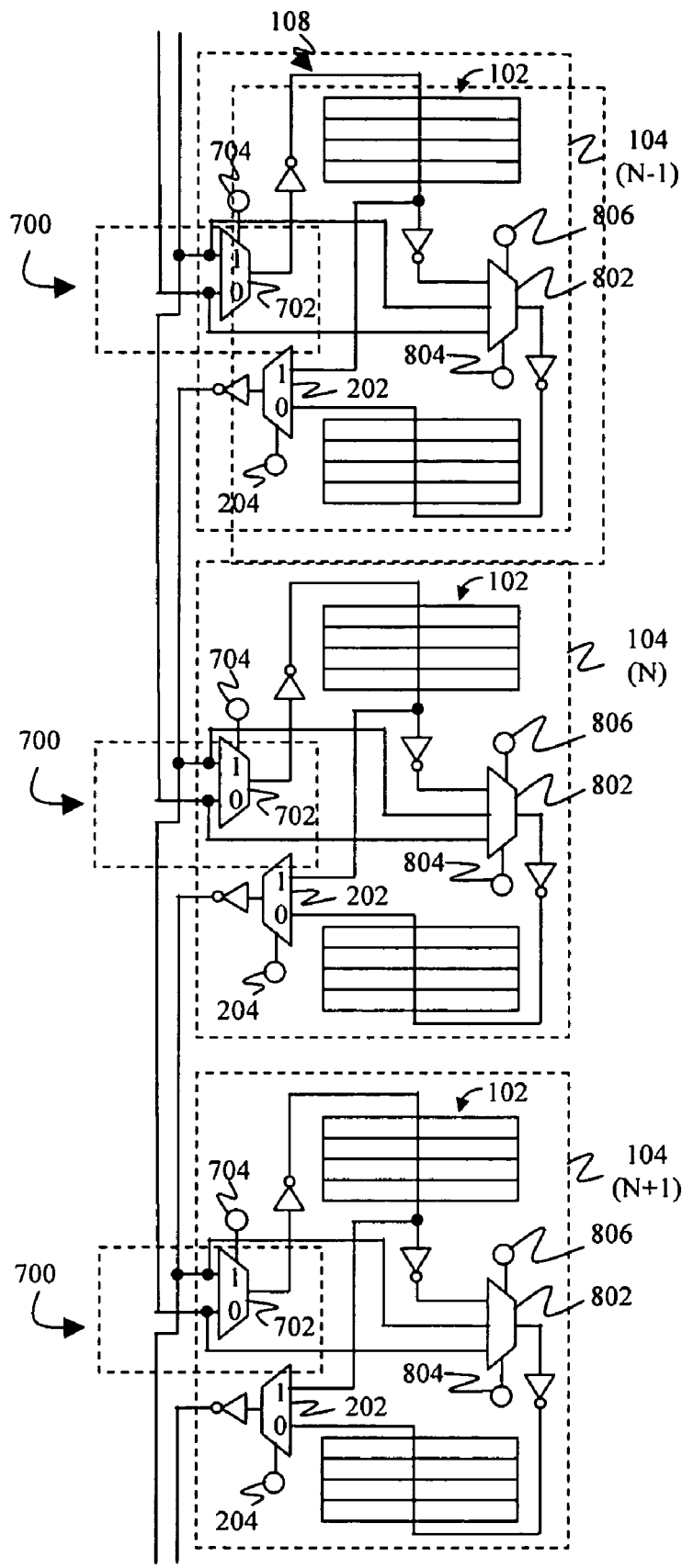

In still another exemplary embodiment depicted in FIG. 9, redundancy circuit 700 is connected to a carry chain 108 with a bypass-able portion that is selectable between a first location and a second location within LAB 104. More particularly, in addition to multiplexer 802, which is described above, carry chain 108 includes multiplexer 202, which can be used to bypass one or more LEs 102 located in the bottom portion of LAB 104.

In the exemplary embodiments depicted in FIGS. 7–9, the logic components used to bypass the LEs in a portion of the LAB have been located in the middle of the LAB. It should be recognized, however, that these logic components can be located at various locations in the LAB.

For example, in an exemplary embodiment depicted in FIG. 10, redundancy circuit 700 is connected to carry chain 108 with a 3:1 multiplexer 1002 located at the bottom of LAB 104. In this exemplary embodiment, the bypass-able portion of carry chain 108 is located at the bottom of LAB 104. Multiplexer 1002 is also connected to select signal 704 of redundancy circuit 700 and a RAM bit 1004 to select between a first input, a second input, and a third input.

In the present exemplary embodiment, when the current LAB 104 (N) is skipped, the first input of multiplexer 1002 is selected and a carry signal is propagated from carry signal 108 from the preceding LAB 104 (N–1) to the carry signal 108 of the next LAB 104 (N+1) to bypass the LEs 102 in LAB 104 (N). When the current LAB 104 (N) is not skipped and the bypass-able portion located at the bottom portion of LAB 104 (N) is not bypassed, the second input of multiplexer 1002 is selected and a carry signal is propagated from carry chain 108 from preceding LAB 104 (N–1) through a second series of LEs 102 in LAB 104 (N). When the current LAB 104 (N) is not skipped and the bypass-able portion located at the bottom of LAB 104 (N) is bypassed, the third input of multiplexer 1002 is selected and a carry signal is propagated from carry chain 108 from preceding LAB 104 (N–1) through a first series of LEs 102 in LAB 104 (N), where one or more of the LEs 102 in the second series are not in the first series. In the present exemplary embodiment, the LEs 102 in the first series is a subset of the second series.

In another exemplary embodiment depicted in FIG. 11, redundancy circuit 700 is connected to carry chain 108 with a 4:1 multiplexer 1102 located at the top of LAB 104. In this exemplary embodiment, the bypass-able portion of carry chain 108 is located at the bottom of LAB 104. Multiplexer 1102 is also connected to select signal 704 of redundancy circuit 700 and a RAM bit 1104 to select between a first input, a second input, a third input, and a fourth input. When the preceding LAB 104 (N–1) is skipped and the bypass-able portion located at the bottom of LAB 104 (N–2) is not bypassed, the first input of multiplexer 1102 is selected and a carry signal is propagated through a second series of LEs 102 in LAB 104 (N–2) to the carry signal 108 of LAB 104 (N) to bypass the LEs 102 in LAB 104 (N–1). When the preceding LAB 104 (N–1) is skipped and the bypass-able portion located at the bottom of LAB 104 (N–2) is bypassed, the second input of multiplexer 1102 is selected and a carry signal is propagated through a first series of LEs 102 in LAB 104 (N–2), where one or more of the LEs 102 in the second series are not in the first series. In the present exemplary embodiment, the LEs 102 in the first series is a subset of the second series. The carry signal is then propagated to the carry signal 108 of LAB 104 (N) to bypass the LEs 102 in LAB 104 (N–1). When the preceding LAB 104 (N–1) is not skipped and the bypass-able portion located at the bottom portion of LAB 104 (N–1) is not bypassed, the third input of multiplexer 1102 is selected and a carry signal is propagated through a second set of LEs 102 in LAB 104 (N–1). When the preceding LAB 104 (N–1) is not skipped and the bypass-able portion located at the bottom portion of LAB 104 (N–1) is bypassed, the fourth input of multiplexer 1102 is selected and a carry signal is propagated from a first set of LEs 102 in LAB 104 (N–1).

V. Carry Select

With reference to FIG. 12, in one exemplary embodiment, LAB 104 includes a carry select circuit 1200 and redundancy circuit 700. In the present exemplary embodiment, carry select circuit 1200 includes a multiplexers 1202 and 1204. As depicted in FIG. 12, multiplexer 1202 is connected to the output of multiplexer 702 of redundancy circuit 700. Thus, the output of multiplexer 702 functions as a carry select signal for multiplexer 1202. As also depicted in FIG. 12, multiplexer 1202 includes a first input and a second input. In the present embodiment, the first input includes a first pre-computed value for a first set of LEs 102. The second input includes a second pre-computed value for the first set of LEs 102. Thus, when the carry select signal is a zero, the first input of multiplexer 1202 is selected. When the carry select signal is a one, the second input of multiplexer 1202 is selected.

Similarly, multiplexer 1204 is connected to the output of multiplexer 1202, which functions as a carry select signal for multiplexer 1204. As depicted in FIG. 12, multiplexer 1204 includes a first input and a second input. The first input includes a pre-computed value for a second set of LEs 102. The second input includes a second pre-computed value for the second set of LEs 102. Thus, when the carry select signal is a zero, the first input of multiplexer 1204 is selected. When the carry select signal is a one, the second input of multiplexer 1204 is selected.

With reference now to FIG. 13, in another exemplary embodiment, LAB 104 includes carry select circuit 1200, redundancy circuit 700, and carry chain 108. It should be recognized that carry select circuit 1200, redundancy circuit 700, and carry chain 108 can share components. For example, multiplexer 1302 is a component of both carry select circuit 1200 and carry chain 108.

As depicted in FIG. 13, multiplexer 1302 is connected to the output of multiplexer 702, which functions as a carry select signal for multiplexer 1302, and a RAM bit 1304. As also depicted in FIG. 13, multiplexer 1302 includes a first input, a second input, and a third input. The first input includes a pre-computed value for a first set of LEs 102. The second input includes a second pre-computed value for the first set of LEs 102. The third input is connected to the output of multiplexer 702. Thus, when the carry select signal is zero and the first set of LEs 102 is not bypassed, the first input of multiplexer 1302 is selected. When the carry select signal is one and the first set of LEs 102 is not bypassed, the second input of multiplexer 1302 is selected. When the first set of LEs 102 is bypassed, the third input of multiplexer 1302 is selected.

Similarly, multiplexer 1306 is connected to the output of multiplexer 1302, which functions as a carry select signal for multiplexer 1306, and a RAM bit 1308. As depicted in FIG. 13, multiplexer 1306 includes a first input, a second input, and a third input. The first input includes a pre-computed value for a second set of LEs 102. The second input includes a second pre-computed value for the second set of LEs 102. The third input is connected to the output of multiplexer 1302. Thus, when the carry select signal is zero and the second set of LEs 102 is not bypassed, the first input of multiplexer 1306 is selected. When the carry select signal is one and the second set of LEs 102 is not bypassed, the second input of multiplexer 1306 is selected. When the second set of LEs 102 is bypassed, the third input of multiplexer 1306 is selected.

Figure 14:
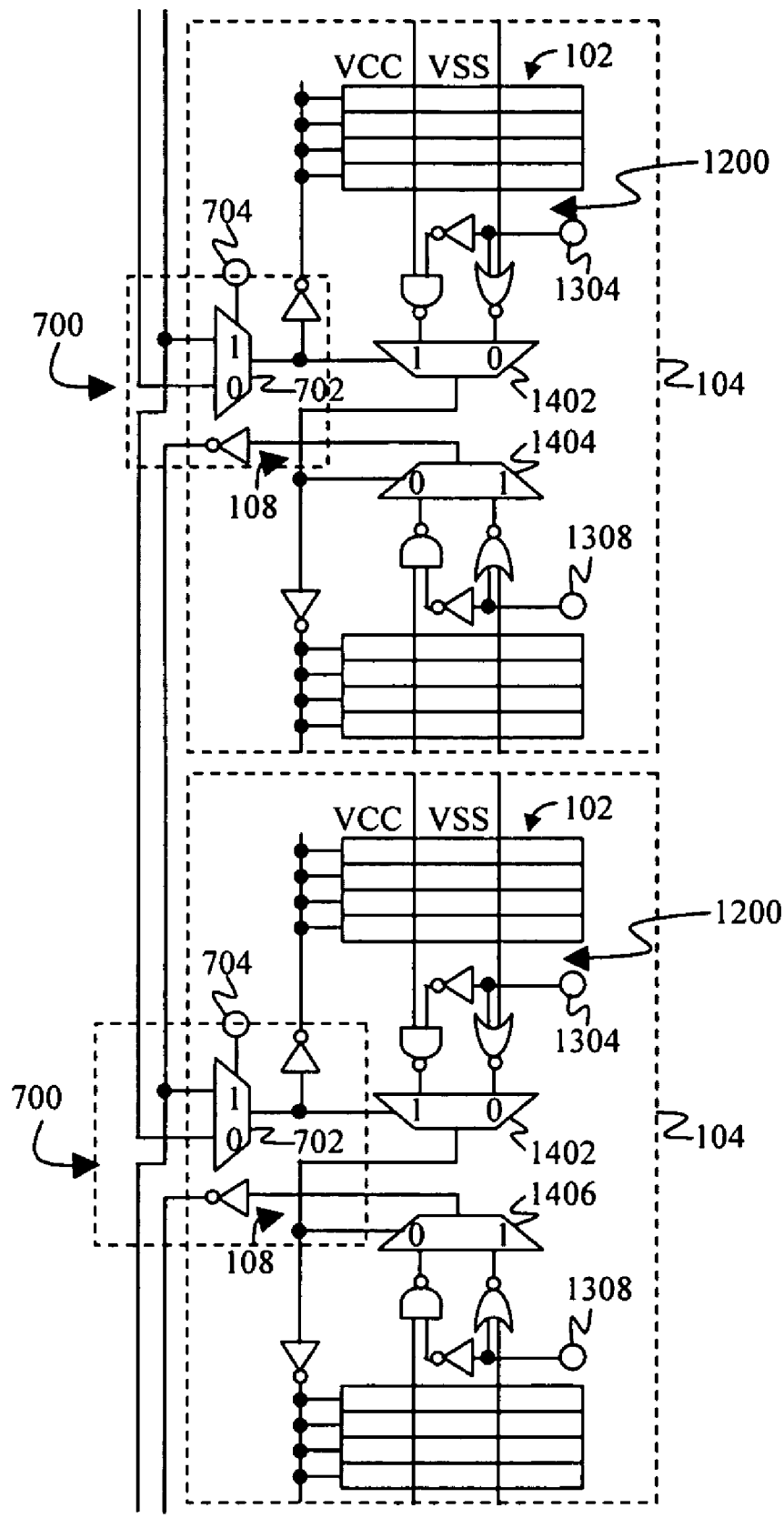

With reference to FIG. 14, in still another exemplary embodiment, LAB 104 includes carry select circuit 1200, redundancy circuit 700, and bypass-able carry chain 108. In contrast to the embodiment depicted in FIG. 13, in the present exemplary embodiment depicted in FIG. 14, the logic components include 2:1 multiplexers 1402 and 1404, NAND gates, and NOR gates. The NAND and NOR gates can be used to initialize carry chain 108. For a more detailed description of initializing a carry chain, see co-pending U.S. patent application Ser. No. 10/801,242, entitled INITIALIZING A CARRY CHAIN IN A PROGRAMMABLE LOGIC DEVICE, filed on Mar. 15, 2004, the entire content of which is incorporated herein by reference.

VI. Fixed Bypass

Figure 15:
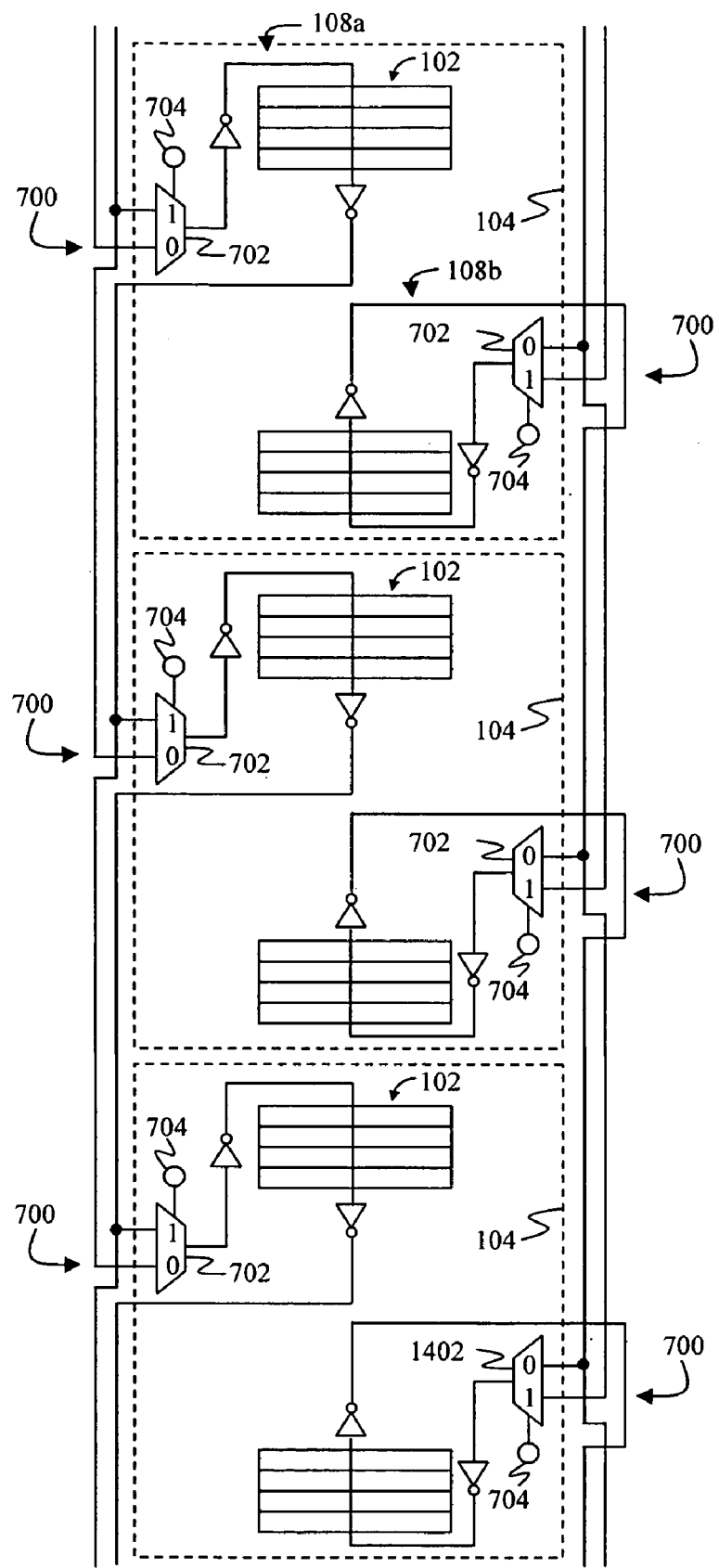

With reference to FIG. 15, in an exemplary embodiment, LAB 104 includes redundancy circuit 700 and a carry chain with a fixed bypass. In the present exemplary embodiment, the carry chain in LAB 104 is split into dual carry chains 108a and 108b. As depicted in FIG. 15, carry chain 108a propagates a carry signal through a first series of LEs 102 in LAB 104. Carry chain 108b propagates a carry signal through a second series of LEs 102 in LAB 104. In the present exemplary embodiment, none of the LEs 102 in the second series are in the first series. As also depicted in FIG. 15, in the present exemplary embodiment, carry chains 108a and 108b can be implemented without using logic components, which reduces the delay in propagating the carry signal.

With reference to FIG. 16, in another exemplary embodiment, carry chains 108a and 108b are depicted in LAB 104 where the logic components (e.g., multiplexers) are located at the top of LAB 104. As depicted in FIG. 16, carry chain 108a propagates a carry signal through a first series of LEs 108 in LAB 104. Carry chain 108b propagates a carry signal through a second series of LEs 102 in LAB 104. The PLD architecture also includes a redundancy circuits 700.

With reference to FIG. 17, in still another exemplary embodiment, carry chains 108a and 108b are depicted in LAB 104 where multiplexers for LAB 104 are located at the bottom of LAB 104. As depicted in FIG. 17, carry chain 108a propagates a carry signal through a first series of LEs 108 in LAB 104. Carry chain 108b propagates a carry signal through a second series of LEs 102 in LAB 104. The PLD architecture also includes a redundancy circuit 700.

Figure 18:
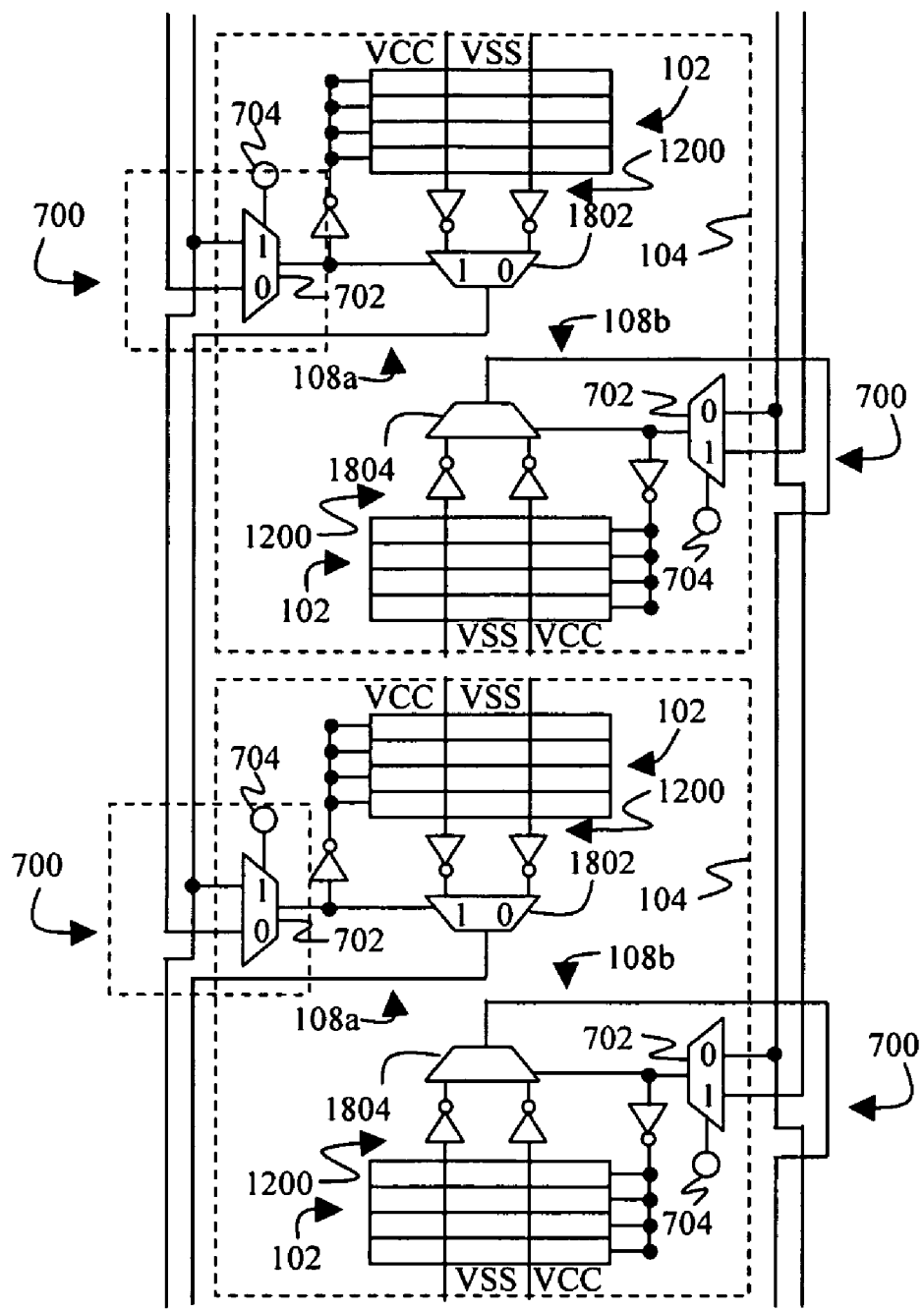
FIG. 18 is a block diagram of exemplary LABs with redundancy circuits, carry select circuits, and carry chains having fixed bypass portions.

With reference to FIG. 18, in still another embodiment, LAB 104 includes carry chains 108a and 108b, redundancy circuits 700, and carry select circuit 1200. As depicted in FIG. 18, carry chain 108a propagates a carry signal through a first series of LEs 102 in LAB 104. Carry chain 108b propagates a carry signal through a second series of LEs 102 in LAB 104. Carry select circuit 1200 includes a multiplexer 1802 connected to the output of multiplexer 702 of redundancy circuit 700, which functions as a carry select signal. As also depicted in FIG. 18, multiplexer 1802 includes a first input and a second input. The first input includes a first pre-computed value for the first set of LEs 102. The second input includes a second pre-computed value for the first set of LEs 102. Similarly, a multiplexer 1804 is connected to the output of multiplexer 702, which functions as a carry select signal. Multiplexer 1804 includes a first input and a second input. The first input includes a first pre-computed value for the second set of LEs 102. The second input includes a second pre-computed value for the first set of LEs 102.

VII. Metal Layer Options and Carry Chain Initialization

Figure 19:
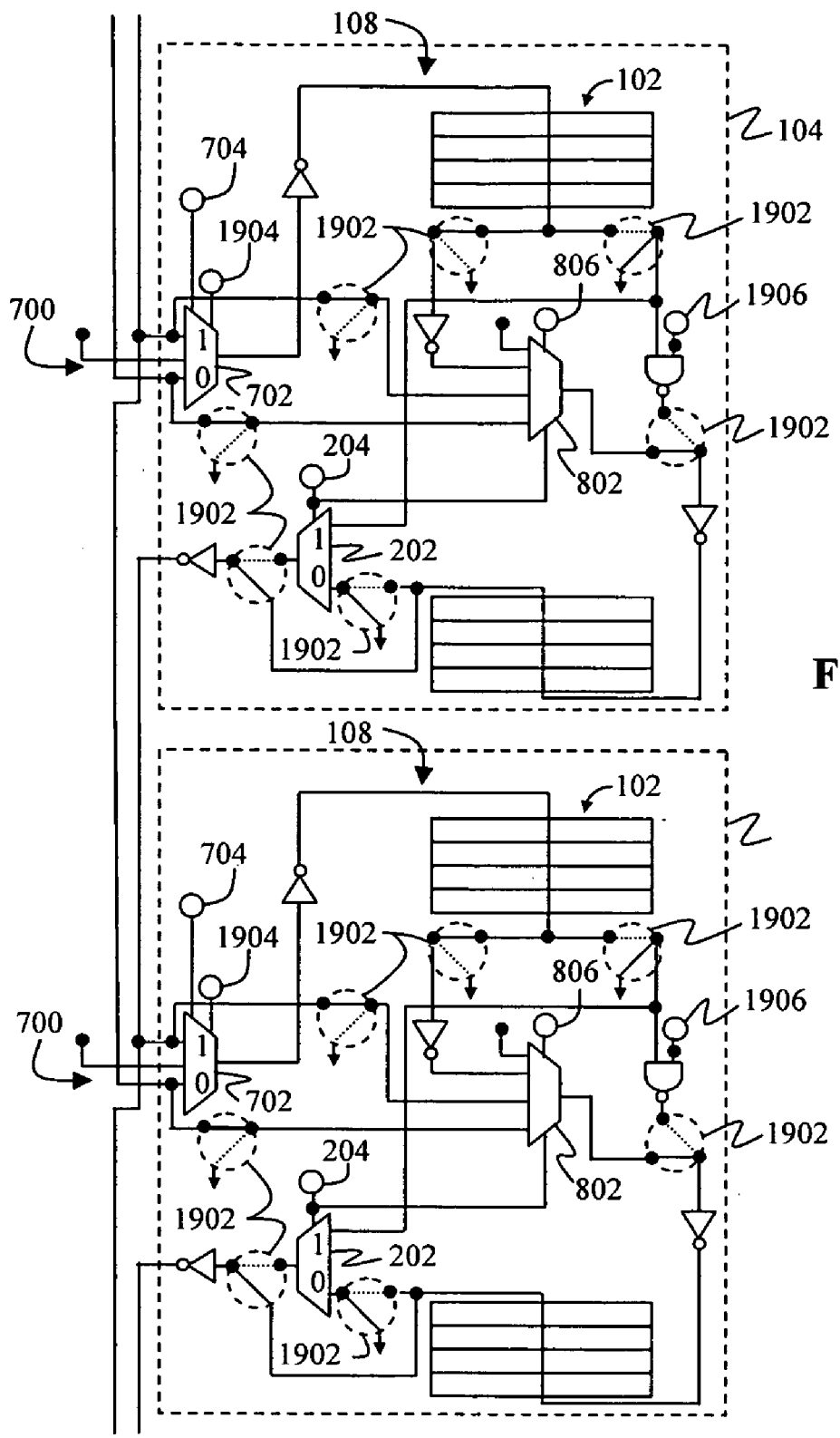
FIG. 19 is a block diagram of exemplary LABs with metal layer option regions.

With reference to FIG. 19, in one exemplary embodiment, LAB 104 includes a carry chain 108 having metal layer option regions 1902. When the layout for LAB 104 is implemented, metal layer option regions 1902 can be formed in accordance with a first layout or a second layout. When metal layer option regions 1902 are formed in accordance with the first layout, the bypass-able region of carry chain 108 in LAB 104 is located in a first portion of LAB 104. When metal layer option regions 1902 are formed in accordance with the second layout, the bypass-able region of carry chain 108 in LAB 104 is located in a second portion of LAB 104.

For example, similar to the exemplary embodiment depicted in FIG. 8, in the exemplary embodiment depicted in FIG. 19, when metal layer option regions 1902 are formed with the solid lines, the bypass-able region of carry chain 108 in LAB 104 is located in the top portion of LAB 104. Similar to the exemplary embodiment depicted in FIG. 7, in the exemplary embodiment depicted in FIG. 19, when metal layer option regions 1902 are formed in accordance with the dashed lines, the bypass-able region of carry chain 108 in LAB 104 is located in the bottom portion of LAB 104. Thus, a generic layout can be used for LAB 104, where only the layout within metal layer option regions 1902 are altered to determine the location of the bypass-able portion of carry chain 108.

As described above, an exemplary PLD architecture includes an array of LABs 104. In one exemplary embodiment, the location of the bypass-able portion of carry chain 108 is alternated between columns of LABs 104. For example, in a first column of LABs 104, the bypass-able portion of carry chain 108 can be located at the top of the LABs 104. In a second column adjacent to the first column, the bypass-able portion of carry chain 108 can be located at the bottom of the LABs 104. Alternating the location of the bypass-able portion of carry chain 108 between columns of LABs 104 can more evenly distribute the load on horizontal lines connecting the columns of LABs 104.

In the present exemplary embodiment, carry chain 108 can be initialized at a first location and a second location with LAB 104. In the exemplary embodiment depicted in FIG. 19, carry chain 108 can be initialized at a first location using RAM bits 1904 and at a second location using RAM bit 1906. For a more detailed description of initializing a carry chain, see co-pending U.S. patent application Ser. No. 10/801,242, entitled INITIALIZING A CARRY CHAIN IN A PROGRAMMABLE LOGIC DEVICE, filed on Mar. 15, 2004, the entire content of which is incorporated herein by reference.

VIII. Data Processing System

Figure 20:
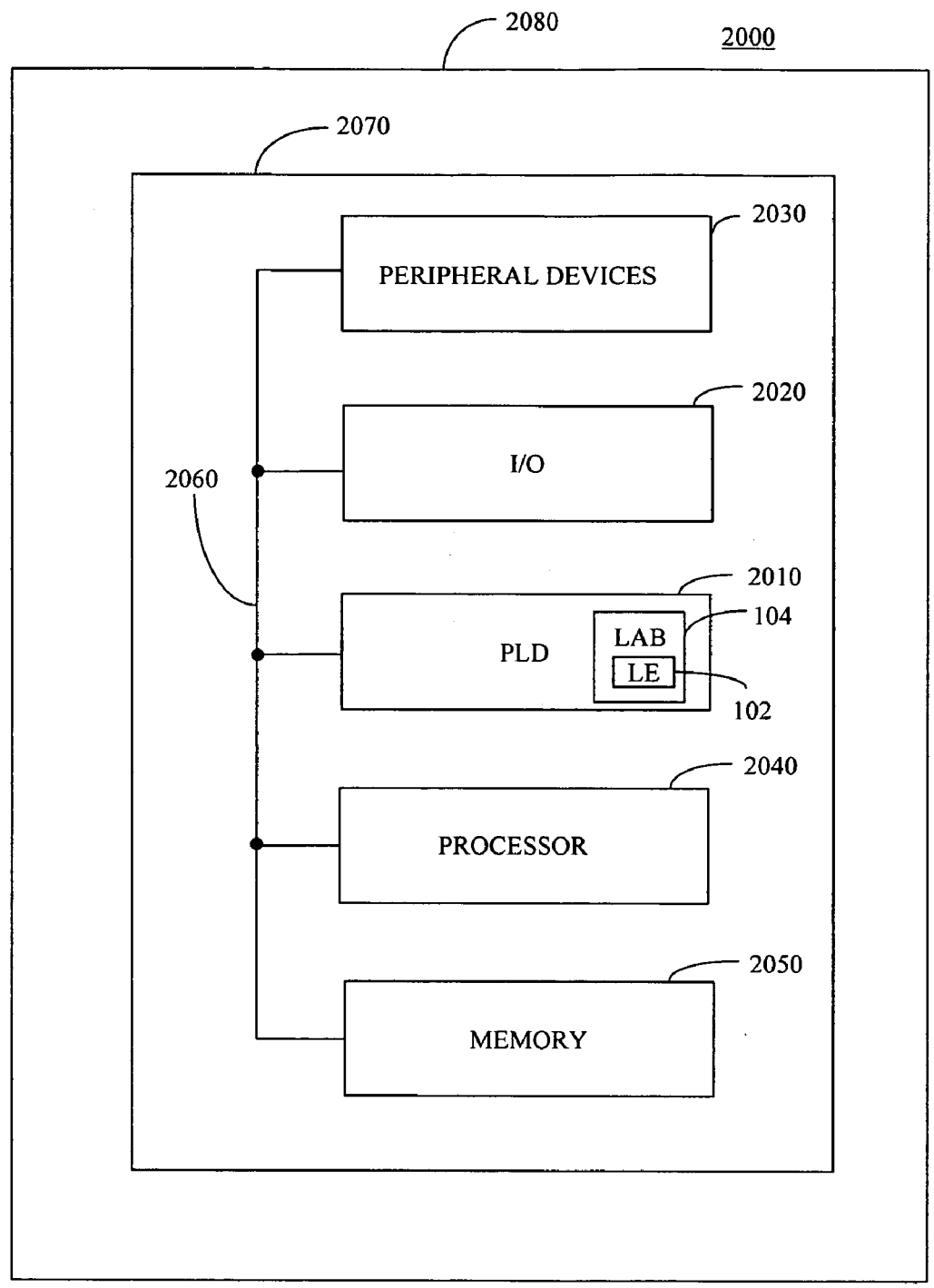
FIG. 20 is a block diagram of an exemplary data processing system.

With reference to FIG. 20, an exemplary PLD 2010 is depicted as a component of an exemplary data processing system 2000. PLD 2010 includes LABs 104 with LEs 102. (Only one LAB 104 and LE 102 are depicted to avoid overcomplicating the drawing.) Data processing system 2000 may include one or more of the following components: a processor 2040; memory 2050; input/out (I/O) circuitry 2020; and peripheral devices 2030. These components are coupled together by a system bus 2060 and are populated on a circuit board 2070, which is contained in an end-user system 2080.

It should be recognized that data processing system 2000 can be used in a wide variety of applications, such as computer networking, data networking, instrumentation, video processing, digital signal processing, or any other application where the advantage of using programmable or reprogrammable logic is desirable. PLD 2010 can be used to perform a variety of different logic functions. For example, PLD 2010 can be configured as a processor or controller that works in cooperation with processor 2040 (or, alternatively, a PLD can act as the sole system processor). PLD 2010 may also be used as an arbiter for arbitrating access to a shared resource in system 2000. In yet another example, PLD 2010 can be configured as an interface between processor 2040 and one of the other components in system 2000.

Although exemplary embodiments have been described, various modifications can be made without departing from the spirit and/or scope of the present invention. Therefore, the present invention should not be construed as being limited to the specific forms shown in the drawings and described above.

We claim:

1. A carry chain in a logic array block having a set of logic elements, the carry chain comprising:
    a first path connecting a first series of logic elements in the logic array block,
    wherein the logic elements in the first series are a subset of the set of logic elements in the logic array block;
    a second path connecting a second series of logic elements in the logic array block,
    wherein one or more of the logic elements in the second series are not in the first series; and
    a multiplexer having an output, a first input, and a second input, wherein when the first input is selected, a carry signal is propagated through the first series of logic elements and through the output of the multiplexer; and
    wherein when the second input is selected, the carry signal is propagated through the second series of logic elements and through the output of the multiplexer.

2. The carry chain of claim 1, wherein the logic elements in the first series are a subset of the logic elements in the second series.

3. The carry chain of claim 2, further comprising:
    a multiplexer located at a top portion of the logic array block having a first input and a second input,
    wherein when the first input is selected, the carry signal is propagated through a first series of logic elements of a preceding logic array block, and
    wherein when the second input is selected, the carry signal is propagated through a second series of logic elements of a preceding logic array block.

4. The carry chain of claim 1, wherein the multiplexer is located in a middle portion of the logic array block.

5. The carry chain of claim 1, wherein the multiplexer is located at a bottom portion of the logic array block.

6. The carry chain of claim 1, further comprising:
    a first multiplexer configured to bypass a first portion of the carry chain, wherein the logic elements in the first series are located in the first portion; and
    a second multiplexer configured to bypass a second portion of the carry chain, wherein the logic elements in the second series are located in the second portion.

7. The carry chain of claim 6,
    wherein the first multiplexer includes:
        a first input connected to a beginning of the first series,
        a second input connected to an end of the first series,
        an output connected to a beginning of the second series, and
    wherein the second multiplexer includes:
        a first input connected to the end of the first series, and
        a second input connected to an end of the second series.

8. The carry circuit of claim 1, further comprising:
    a redundancy circuit connected to the first path and the second path, wherein the redundancy circuit is configured to skip a logic array block in a column of logic array blocks.

9. The carry circuit of claim 8, wherein the redundancy circuit comprises:
    a multiplexer having:
        a first input connected to an output of a carry chain from a preceding logic array block in a preceding row,
        a second input connected to the first input of a multiplexer in a redundancy circuit of the preceding logic array block in the preceding row, and
        an output connected to the first path.

10. The carry circuit of claim 1, further comprising:
    a carry select circuit connected to the first path and the second path, wherein the carry select circuit is configured to provide a first pre-computed value and a second pre-computed value for a set of logic elements.

11. The carry circuit of claim 10, wherein the carry select circuit comprises:
    a first multiplexer having:
        a first input connected to the first series of logic elements, wherein the first input provides the first pre-computed value for the first series of logic elements,
        a second input connected to the first series of logic elements, wherein the second input provides the second pre-computed value for the first series of logic elements,
        an output connected to the second series of logic elements,
        wherein the first multiplexer receives a carry select signal from an input to the first path, and
    a second multiplexer having:
        a first input connected to the second series of logic elements, wherein the first input provides the first pre-computed value for the second series of logic elements,
        a second input connected to the second series of logic elements, wherein the second input provides the second pre-computed value for the second series of logic elements, and wherein the second multiplexer receives a carry select signal from the output of the first multiplexer.

12. The carry chain of claim 1, further comprising:
a first carry chain defined by the first path;
at least a second carry chain defined by the second path, wherein each of the logic elements in the second series are not in the first series.

13. The carry chain of claim 1, further comprising:
one or more metal layer option regions disposed within the first and second paths,
wherein each metal layer option region includes a first layout and a second layout, and
wherein a first region of the logic array block is bypass-able when the metal layer option regions are formed in accordance with the first layout, and
wherein a second region of the logic array block is bypass-able when the metal layer option regions are formed in accordance with the second layout.

14. The carry chain of claim 1, further comprising:
a first column of logic array blocks, each logic array block in the first column having a carry chain with the first path located in a top portion of the carry chain; and
a second column of logic array blocks adjacent to the first column, each logic array block in the second column having a carry chain with the first path located in a bottom portion of the carry chain, wherein the second column is adjacent to the first column.

15. A programmable logic device including the carry chain of claim 1.

16. A digital system comprising a programmable logic device including the carry chain of claim 1.

17. A programmable logic device comprising:
an array of logic elements grouped into a plurality of logic array blocks; and
a carry chain circuit disposed within a logic array block, the carry circuit configured to operate in a first mode and a second mode,
wherein when the carry circuit operates in the first mode, a carry signal is propagated through a first series of logic elements within the logic array block,
wherein when the carry circuit operates in the second mode, a carry signal is propagated through a second series of logic elements within the logic array block, the first series of logic elements being a subset of the second series of logic elements; and
a multiplexer having a first input and a second input,
wherein when the first input is selected, the carry signal is propagated through the multiplexer and the first series of logic elements, and
wherein when the second input is selected, the carry signal is propagated through the multiplexer and the second series of logic elements.

18. The programmable logic device of claim 17, wherein the carry chain further comprises:
a first multiplexer configured to bypass a first portion of the carry chain, wherein the logic elements in the first series are located in the first portion; and
a second multiplexer configured to bypass a second portion of the carry chain, wherein one or more of the logic elements in the second series are located in the second portion.

19. The programmable logic device of claim 17, further comprising:
a redundancy circuit connected to the carry chain, wherein the redundancy circuit is configured to skip a logic array block in a column of logic array blocks.

20. The programmable logic device of claim 19, wherein the redundancy circuit comprises:
a multiplexer having:
a first input connected to an output of a carry chain from a preceding logic array block in a preceding row,
a second input connected to the first input of a multiplexer in a redundancy circuit of the preceding logic array block in the preceding row, and
an output connected to the carry chain.

21. The programmable logic device of claim 17, further comprising:
a carry select circuit connected to the carry chain, wherein the carry select circuit is configured to provide a first pre-computed value and a second pre-computed value for a set of logic elements.

22. The programmable logic device of claim 17, further comprising:
one or more metal layer option regions disposed within the carry chain,
wherein each metal layer option region includes a first layout and a second layout, and
wherein a first region of the logic array block is bypass-able when the metal layer option regions are formed in accordance with the first layout, and
wherein a second region of the logic array block is bypass-able when the metal layer option regions are formed in accordance with the second layout.

23. The programmable logic device of claim 17, further comprising:
a first column of logic array blocks, each logic array block in the first column having a carry chain with the first series of logic elements located in a top portion of the carry chain; and
a second column of logic array blocks adjacent to the first column, each logic array block in the second column having a carry chain with the first series of logic elements located in a bottom portion of the carry chain, wherein the second column is adjacent to the first column.

24. A digital system comprising the programmable logic device of claim 17.

25. A method of forming a carry chain in a logic array block having a set of logic elements, the method comprising:
forming a first path connecting a first series of logic elements in the logic array block,
wherein the logic elements in the first series are a subset of the set of logic elements in the logic array block;
forming a second path connecting a second series of logic elements in the same logic array block,
wherein one or more of the logic elements in the second series are not in the first series; and
a select circuit having a first input, a second input and an output,
wherein when the first input is selected by the select circuit, a carry chain signal is propagated through the output of the select circuit to the first series of logic elements; and
wherein when the second input is selected by the select circuit, the carry chain signal is propagated through the output of the select circuit to the second series of logic elements.

* * * * *